United States Patent [19]
Hong et al.

[11] Patent Number: 5,350,710
[45] Date of Patent: Sep. 27, 1994

[54] DEVICE FOR PREVENTING ANTENNA EFFECT ON CIRCUIT

[75] Inventors: Gary Hong, Hsin; Joe Ko, Hsinchu, both of Taiwan

[73] Assignee: United Microelectronics Corporation, Hsinchu, Taiwan

[21] Appl. No.: 80,536

[22] Filed: Jun. 24, 1993

[51] Int. Cl.$^5$ .......................................... H01L 21/14
[52] U.S. Cl. ........................... 437/170; 437/47; 437/60; 437/195; 156/643
[58] Field of Search ............... 437/47, 60, 51, 228, 437/233, 235, 195, 170, 172; 156/643; 427/69; 257/356, 50, 530

[56] References Cited
U.S. PATENT DOCUMENTS

| | | | |
|---|---|---|---|
| 5,070,384 | 12/1991 | McCollum et al. | 257/530 |
| 5,100,827 | 3/1992 | Lytle | 437/170 |
| 5,111,262 | 5/1992 | Chem et al. | 257/530 |
| 5,270,251 | 12/1993 | Cohen | 437/174 |

*Primary Examiner*—Tom Thomas
*Attorney, Agent, or Firm*—George O. Saile; Stephen B. Ackerman

[57] ABSTRACT

A multi-level conductive interconnection for an integrated circuit with an antifuse device is formed, in and on a silicon substrate, wherein there are large contact pad areas at the periphery of the interconnection. The antifuse device is formed from a thin dielectric between a first and second conductor and is connected to the integrated circuit, and is also connected to a ground reference through a silicon junction in the substrate. The large contact pad area is formed with a layer of metal, and is connected to the integrated circuit through the antifuse device, wherein the antifuse device electrically isolates the contact pad and the integrated circuit to prevent charge build-up during subsequent processing. There is further processing in a plasma environment that would normally produce electrical charge build-up at the gate oxide of the integrated circuit, but wherein the antifuse device prevents charge build-up. A voltage is applied to the antifuse device to create a low impedance element, and formation of the integrated circuit is completed.

18 Claims, 2 Drawing Sheets

DEVICE FOR PREVENTING ANTENNA EFFECT ON CIRCUIT

BACKGROUND OF THE INVENTION

1. Field of the Invention

The invention relates to the manufacture of highly dense integrated circuits and more particularly to the reduction and elimination of electrostatic charge buildup at the device during manufacture in, for example, plasma etching or the like process steps.

2. Description of the Prior Art

In the manufacture of highly dense integrated circuits using Metal Oxide Semiconductor (MOS) technology with conductive layers, electrical charge may build up at the device gate oxide during plasma processing. The charge accumulates on floating polysilicon and metal layers electrically connected to the gate oxide. Interconnection metal lines act as "antennas", amplifying the charging effect and leading to trapped charges at the gate oxide. These trapped charges can cause yield loss and reliability failures.

Workers in the field have verified this problem experimentally. Shone et al in "Gate Oxide Charging and Its Elimination for Metal Antenna Capacitor and Transistor in VLSI CMOS Double Layer Metal Technology" (published in "Symposium on VLSI Technology, pp. 73-74 in June, 1988) verified the antenna effect experimentally. They found that the double metal layer technologies worsened the effect by the ratio of the antenna area to the gate oxide area. The worst degradation of gate oxide occurred during oxynitride deposition, however other plasma processing is also believed to lead to trapped charges at the gate oxide.

SUMMARY OF THE INVENTION

It is a principal object of this invention to provide a method for eliminating the antenna effect of accumulated electrical charge on floating polysilicon and metal interconnections connected to the gate oxide. This is accomplished by isolating the polysilicon and metal interconnections from the gate oxide during plasma processing by means of an antifuse device.

This object is achieved by forming a multi-level conductive interconnection for an integrated circuit with an antifuse device, in and on a silicon substrate, wherein there are large contact pad areas at the periphery of the interconnection. An oxide layer is formed on the silicon substrate. A conductive layer is formed on the oxide layer and is connected to the integrated circuit, and is also connected to a ground reference through a silicon junction in the substrate. The large contact pad area is formed with a layer of metal. A first dielectric layer is formed on the first conductive layer. This dielectric layer is patterned to form the dielectric for the antifuse device. A second dielectric layer is formed on the first conductive layer and over the antifuse dielectric. The second dielectric layer is patterned to form an opening to the antifuse device dielectric. A second conductive layer is formed over the second dielectric layer and the antifuse dielectric, to complete formation of the antifuse device and connect the antifuse device to the contact pad, wherein the antifuse device electrically isolates the contact pad and the integrated circuit to prevent charge build-up during subsequent processing. Further processing is done in a plasma environment that would normally produce electrical charge build-up at the gate oxide of the integrated circuit, but wherein the antifuse device prevents charge build-up. A voltage is applied to the antifuse device to create a low impedance element, and formation of the integrated circuit is completed.

DESCRIPTION OF THE PREFERRED EMBODIMENTS

Figure 1:
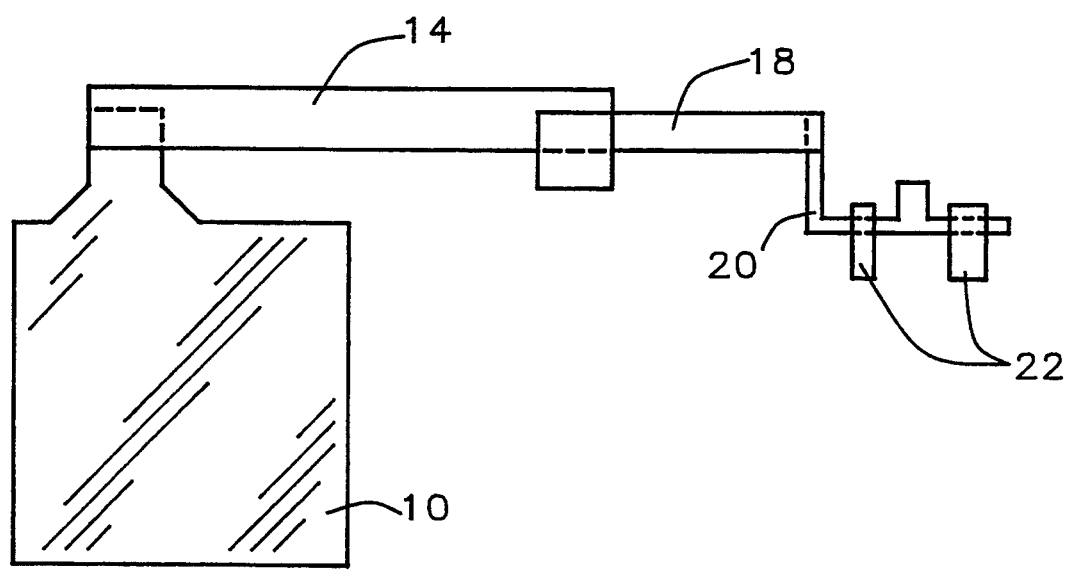
FIG. 1 is a schematic diagram of the Prior Art process for connecting a large contact pad with an active MOS device using one level of metal, which could lead to device damage due to the antenna effect.

Referring now to FIG. 1, there is shown a schematic diagram to demonstrate the problem found in prior art devices. As can be seen in FIG. 1, in the manufacture of MOS semiconductor devices, a large contact pad area 10 (of typical size 100 by 100 micrometers, and more than about 30 by 30 micrometers) is electrically connected by vias to a polysilicon interconnection 14. The pad area 10 in a double metal process would consist of the two layers of metal. The polysilicon interconnection 14 is connected by vias through an insulating layer to metal interconnection 18. This metal interconnection 18 is connected by vias to polysilicon 20 and then to active devices 22. There is a direct electrical connection among all elements, and charge accumulated during plasma processing on the polysilicon and large metal areas can lead to damage to the devices due to trapped charges.

It is common in the manufacture of integrated circuits today to use plasmas, with two of the most common processes being reactive plasma etching, and plasma enhanced chemical vapor deposition. A plasma is a collection of charged particles, including electrons and positive and negative ions, and it is these charged particles that collect along the conductive surfaces during plasma processing and may produce trapped charges damaging the gate oxide.

Figure 2:
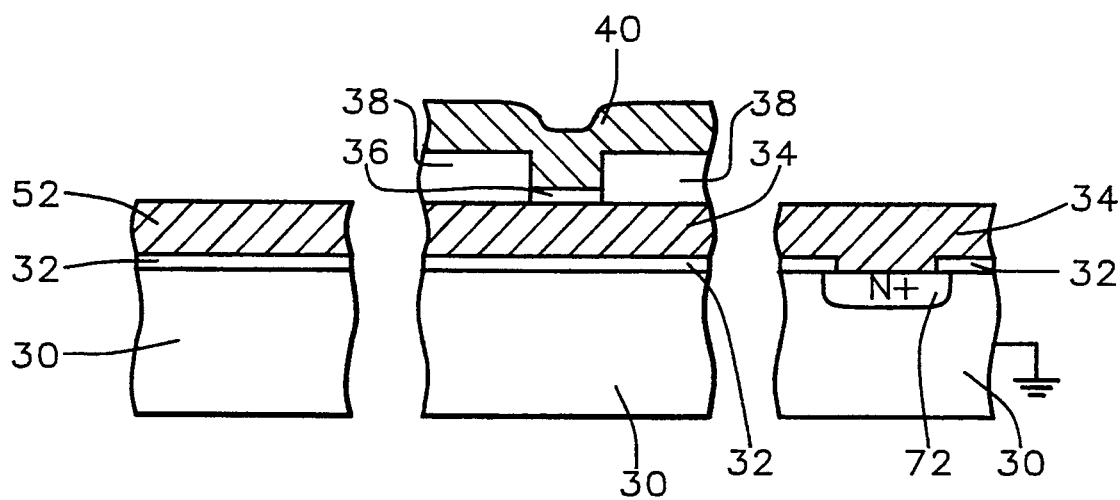
FIGS. 2 to 4 are cross-sectional diagrams of the present invention of using an antifuse device to eliminate the antenna effect in highly dense integrated circuits using MOS technology with conductive layers.

Referring now to FIG. 2, there is shown a silicon substrate 30, upon which is grown thermally a silicon oxide layer 32 by methods well known in the art, with a thickness of between about 500 and 5,000 Angstroms. A first conductive layer 34 is deposited on silicon oxide layer 32. In one embodiment of the invention, this layer is aluminum and is deposited typically by evaporation or sputtering, to a thickness of between about 3,000 and 10,000 Angstroms. This layer is connected to a silicon junction 72 in the substrate, which will act as a terminal during later application of the voltage to the antifuse element. This layer is also connected to the rest of the integrated circuit (not shown). Also formed during this processing step is the large contact pad area 52, which typically has an area of between about 30×30 and 200×200 micrometers.

A layer of aluminum oxide is deposited and patterned by conventional lithography and etching to form the antifuse dielectric 36. This layer has a thickness of between about 100 and 500 Angstroms. An intermetal dielectric layer 38 is then deposited, typically an oxide material or borophosphosilicate glass (BPSG) deposited by chemical vapor deposition to a thickness of between about 1,000 and 10,000 Angstroms. This layer is patterned by standard lithography and etching to expose the dielectric 36. A second layer of metal 40, of a thickness of between about 3,000 and 10,000 Angstroms is deposited over the intermetal dielectric 38 and connecting to antifuse dielectric 36 to complete the antifuse element.

Plasma processing steps may now be completed without accumulating charge and causing the antenna effect. The antifuse device acts as an open circuit between the large contact pad area and the rest of the integrated circuit. Any charges that accumulate on the large contact pad area or on the second conductive layer are prevented from accumulating at the gate oxide of the active devices and causing the antenna effect problems.

Figure 3:
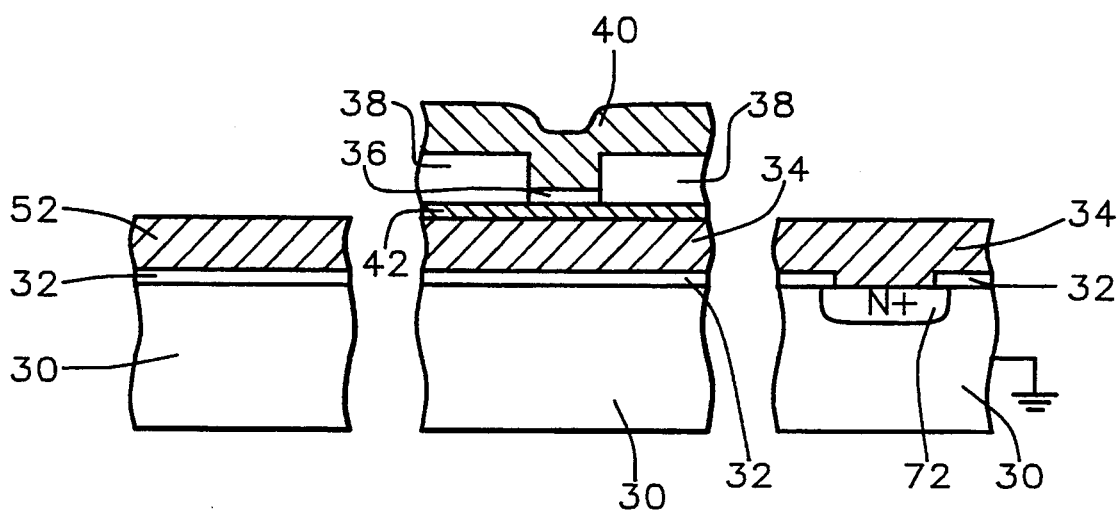

A further embodiment of the invention is shown in FIG. 3. This embodiment is identical to that shown in FIG. 2, except that first conductive layer 34 can be any typical first level metal, such as aluminum, titanium or tungsten, and a thin layer of titanium 42 is deposited on first conductive layer 34 to a thickness of between about 500 and 2,000 Angstroms. Also, antifuse dielectric 36 is titanium oxide, and has a thickness of between about 60 and 200 Angstroms. Silicon junction 72 is connected via layer 34.

A further embodiment of the FIG. 3 structure is to deposit polysilicon as first conductive layer 34, and a metal silicide, such as tungsten silicide, as layer 42. Polysilicon is deposited to a thickness of between about 800 and 2,000 Angstroms, typically by Low Pressure Chemical Vapor Deposition (LPCVD). Metal silicide layer 42 is deposited typically by evaporation, to a thickness of between about 800 and 3,000 Angstroms. In this embodiment, dielectric 36 is silicon oxide, deposited to a thickness of between about 100 and 500 Angstroms. The large contact pad 52 in this embodiment is formed simultaneously with and using the same metal as second conductive layer 40.

Figure 4:
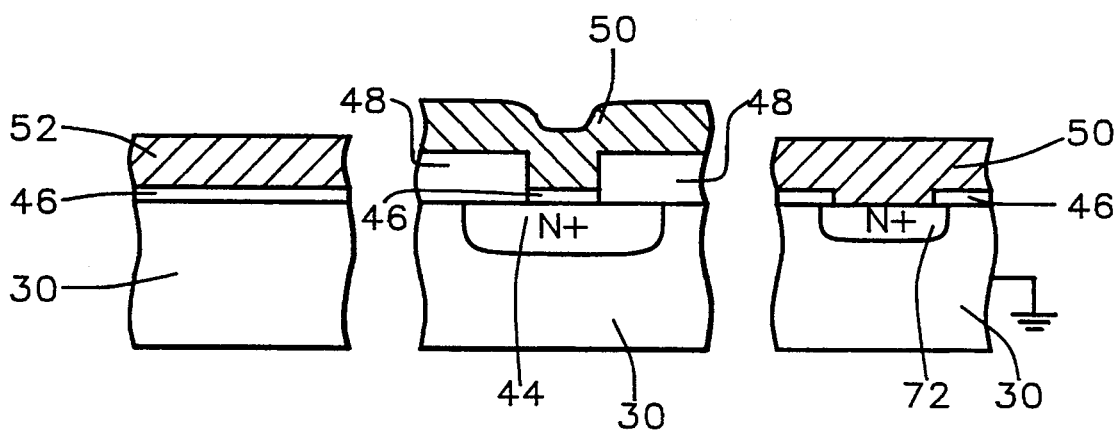

Referring now to FIG. 4, a further embodiment of the invention is shown in which the lower conductor of the antifuse device is a heavily doped N+silicon junction 44 in P substrate 30. This junction is formed by methods well known to those of ordinary skill in the art, and simultaneously with silicon junction 72. A silicon oxide layer is then grown thermally by conventional means to a thickness of between about 100 and 500 Angstroms and patterned to form antifuse dielectric 46. Dielectric layer 48 of, for instance, silicon dioxide, is deposited and patterned to form an opening to the antifuse dielectric 46. Second conductive layer 50 is deposited over dielectric layer 48 and can be either metal or polysilicon, completes formation of the antifuse device. When second conductive layer 50 is a metal, the large contact pad 52 is formed simultaneously with and using the same metal as second conductive layer 50. When polysilicon is used for the second conductive layer, the large contact pad 52 is formed of metal in a separate processing step.

Figure 5A:
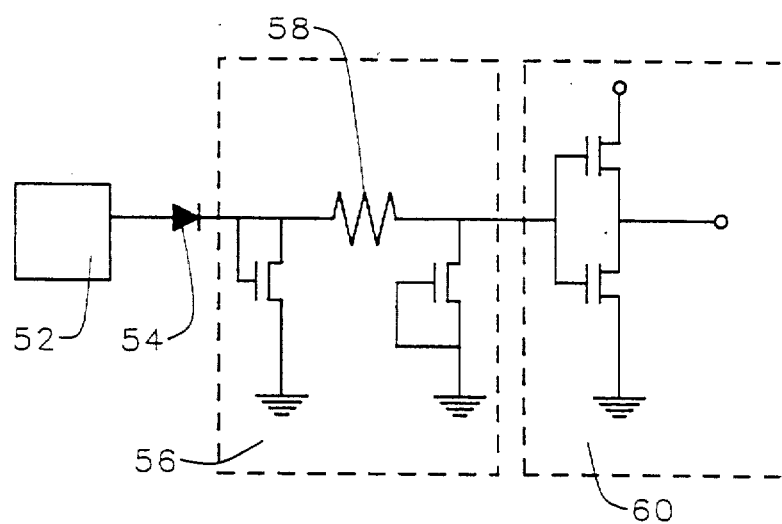
FIGS. 5a and 5b are schematic diagrams of a completed circuit using the present invention, showing the antifuse element before a voltage is applied, and the subsequent low impedance element after a voltage is applied.

FIG. 5a shows a schematic diagram of the completed structure. Large metal contact pad 52 is connected to antifuse device 54, which electrically isolates the pad from the rest of the integrated circuit during plasma processing and protects gate oxides in the integrated circuit device structures from damage due to the antenna effect. Also shown is ESD input protection circuit 56, including resistor 58, and internal circuitry 60. When plasma processing is complete, a voltage of between about $-15$ and $-50$ volts (relative to the P substrate) is applied to antifuse 54, via several 10 microsecond pulses, until a low impedance element is formed. A positive voltage of between about $+15$ and $+50$ volts may also be used, depending on the needs of the ESD input protection circuit.

Figure 5B:
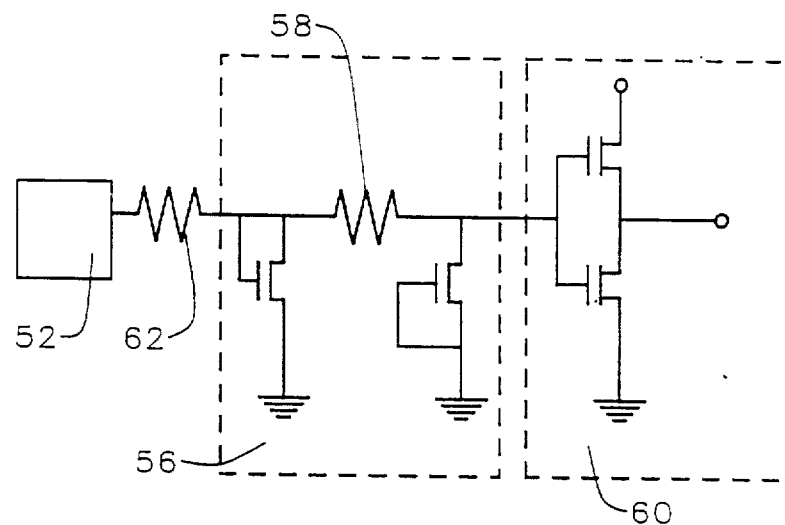

FIG. 5b shows the schematic diagram with the low impedance element 62. Resistor 58 of the ESD input protection circuit 56 is designed with a resistance of between about 100 and 2,000 ohms to take into account the resistance of low impedance element 62, which has a resistance of between about 10 and 200 ohms.

While the invention has been particularly shown and described with reference to the preferred embodiments thereof, it will be understood by those skilled in the art that various changes in form and details may be made without departing from the spirit and scope of the invention.

What is claimed is:

1. A method of forming a multi-level conductive interconnection for an integrated circuit with an antifuse device, in and on a silicon substrate, wherein there are large contact pad areas at the periphery of said interconnection, comprising:

forming an oxide layer on said silicon substrate;

forming a conductive layer on said oxide layer, connected to said integrated circuit, and also connected to a ground reference through a silicon junction in said substrate;

forming said large contact pad areas with a layer of metal;

forming a first dielectric layer on said first conductive layer;

patterning said first dielectric layer to form the dielectric for said antifuse device;

forming a second dielectric layer on said first conductive layer and over said dielectric;

patterning said second dielectric layer to form an opening to said antifuse device dielectric;

forming a second conductive layer over said second dielectric layer and said dielectric, to complete formation of said antifuse device and connect said antifuse device to said contact pad, wherein said antifuse device electrically isolates said contact pad and said integrated circuit to prevent charge build-up during subsequent processing;

further processing in a plasma environment that would normally produce electrical charge build-up at gate oxide of said integrated circuit, but wherein said antifuse device prevents said charge build-up;

applying a voltage to said antifuse device to create a low impedance element; and completing formation of said integrated circuit.

2. The method of claim 1 wherein said processing in a plasma environment is plasma enhanced chemical vapor deposition.

3. The method of claim 1 wherein said processing in a plasma environment is plasma etching.

4. The method of claim 3 wherein said plasma etching is a sputter etch.

5. The method of claim 1 wherein said first conductive layer is a metal and is formed simultaneously with said large contact pad, said first dielectric layer is titanium oxide, said second conductive layer is a metal, and further comprising forming a layer of titanium over said first layer of metal.

6. The method of claim 5 wherein said titanium oxide has a thickness of between about 60 and 200 Angstroms.

7. The method of claim 1 wherein said first conductive layer is aluminum and is formed simultaneously with said large contact pad, said first dielectric layer is aluminum oxide, and said second conductive layer is a metal.

8. The method of claim 7 wherein said aluminum oxide has a thickness of between about 100 and 500 Angstroms.

9. The method of claim 1 wherein said first conductive layer is polysilicon, said first dielectric layer is silicon oxide, said second conductive layer is a metal and is formed simultaneously with said large contact pad, and further comprising forming a layer of silicide over said first conductive layer of polysilicon.

10. The method of claim 9 wherein said silicon oxide has a thickness of between about 100 and 500 Angstroms.

11. The method of claim 1 wherein said first conductive layer is a silicon junction, said first dielectric layer is a silicon oxide, and said second conductive layer is a metal and is formed simultaneously with said large contact pad.

12. The method of claim 11 wherein said second conductive layer is polysilicon and is electrically connected to said large contact pad, and said silicon oxide has a thickness of between about 100 and 500 Angstroms.

13. A method of subjecting an integrated circuit, having large conductive regions on its surfaces which are electrically connected to device structures, to a plasma process comprising:

forming an antifuse device in between said large conductive regions and said device structures, thereby electrically isolating said large conductive regions from said device structures;

placing said integrated circuit in a chamber for accomplishing said plasma process;

subjecting said integrated circuit to a plasma process wherein said antifuse device prevents damage to said device structures;

removing said integrated circuit from said chamber; and applying a voltage to said antifuse device to create a low impedance element.

14. The method of claim 13 wherein said large first conductive regions include a large contact pad located at the periphery of said integrated circuit.

15. The method of claim 14 wherein said large contact pad has a size of greater than about 30×30 micrometers.

16. The method of claim 13 wherein said plasma process is plasma enhanced chemical vapor deposition.

17. The method of claim 13 wherein said plasma process is plasma etching.

18. The method of claim 17 wherein said plasma etching is a sputter etch.

* * * * *

UNITED STATES PATENT AND TRADEMARK OFFICE
CERTIFICATE OF CORRECTION

PATENT NO. : 5,350,710
DATED : Sep. 27, 1994
INVENTOR(S) : Hong et al.

It is certified that error appears in the above-indentified patent and that said Letters Patent is hereby corrected as shown below:

Add the Drawing Sheets consisting of FIGS. 5A and 5B as shown on the attached pages.

Signed and Sealed this

Twenty-seventh Day of December, 1994

Attest:

BRUCE LEHMAN

Attesting Officer            Commissioner of Patents and Trademarks